United States Patent
Aldag et al.

(10) Patent No.: US 7,255,640 B2
(45) Date of Patent: Aug. 14, 2007

(54) CABLE AND AIR MANAGEMENT ADAPTER SYSTEM FOR ENCLOSURES HOUSING ELECTRONIC EQUIPMENT

(75) Inventors: Philip R. Aldag, Columbus, OH (US); Brad L. Reinbolt, Powell, OH (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 10/683,863

(22) Filed: Oct. 13, 2003

(65) Prior Publication Data

US 2004/0190270 A1    Sep. 30, 2004

Related U.S. Application Data

(60) Provisional application No. 60/417,931, filed on Oct. 11, 2002.

(51) Int. Cl.
    *H02B 1/00* (2006.01)
    *H05K 5/02* (2006.01)
(52) U.S. Cl. .................. 454/184; 361/676; 361/687
(58) Field of Classification Search ............... 454/184; 361/690, 691, 692, 693, 695, 687, 676, 688, 361/697
See application file for complete search history.

(56) References Cited

U.S. PATENT DOCUMENTS

| | | | | |
|---|---|---|---|---|
| 3,691,432 A | * | 9/1972 | Edfors et al. ............... 361/687 |
| 4,461,519 A | * | 7/1984 | Hildebrandt et al. ....... 312/265.6 |
| 5,544,012 A | * | 8/1996 | Koike ........................ 361/695 |
| 5,586,012 A | * | 12/1996 | Lerman ...................... 361/826 |
| 6,185,098 B1 | * | 2/2001 | Benavides ................... 361/695 |
| 6,417,443 B1 | * | 7/2002 | Smith ...................... 174/17 VA |
| 6,557,357 B2 | * | 5/2003 | Spinazzola et al. ............ 62/89 |
| 6,613,981 B1 | * | 9/2003 | Hathcock et al. ............. 174/69 |
| 6,646,893 B1 | * | 11/2003 | Hardt et al. ................. 361/826 |
| 6,745,579 B2 | * | 6/2004 | Spinazzola et al. ............ 62/89 |
| 6,776,706 B2 | * | 8/2004 | Kipka et al. ................. 454/184 |
| 6,788,535 B2 | * | 9/2004 | Dodgen et al. .............. 361/695 |
| 6,791,027 B1 | * | 9/2004 | Nicolai et al. ................ 174/50 |
| 6,816,372 B2 | * | 11/2004 | Huettner et al. ............. 361/695 |
| 6,819,563 B1 | * | 11/2004 | Chu et al. .................... 361/696 |
| 2004/0050808 A1 | * | 3/2004 | Krampotich et al. ........... 211/26 |

OTHER PUBLICATIONS

SMC Platinum 42 Enclosure Specification Book, Release 1.1A (Oct. 15, 2003).

* cited by examiner

*Primary Examiner*—Gregory Wilson
(74) *Attorney, Agent, or Firm*—Locke Liddell & Sapp PLLC

(57) ABSTRACT

The present invention provides a cable-air management adapter system ("CAMAS") that addresses airflow, heat buildup and cable routing concerns in enclosures that house electronic equipment. The CAMAS allows users to work from a single frame to increase an enclosure's size by adding multiple expansion channels that form a platform on which multiple airflow, heat dissipation and cable support management options are installed, eliminating the need to replace the enclosure.

26 Claims, 6 Drawing Sheets

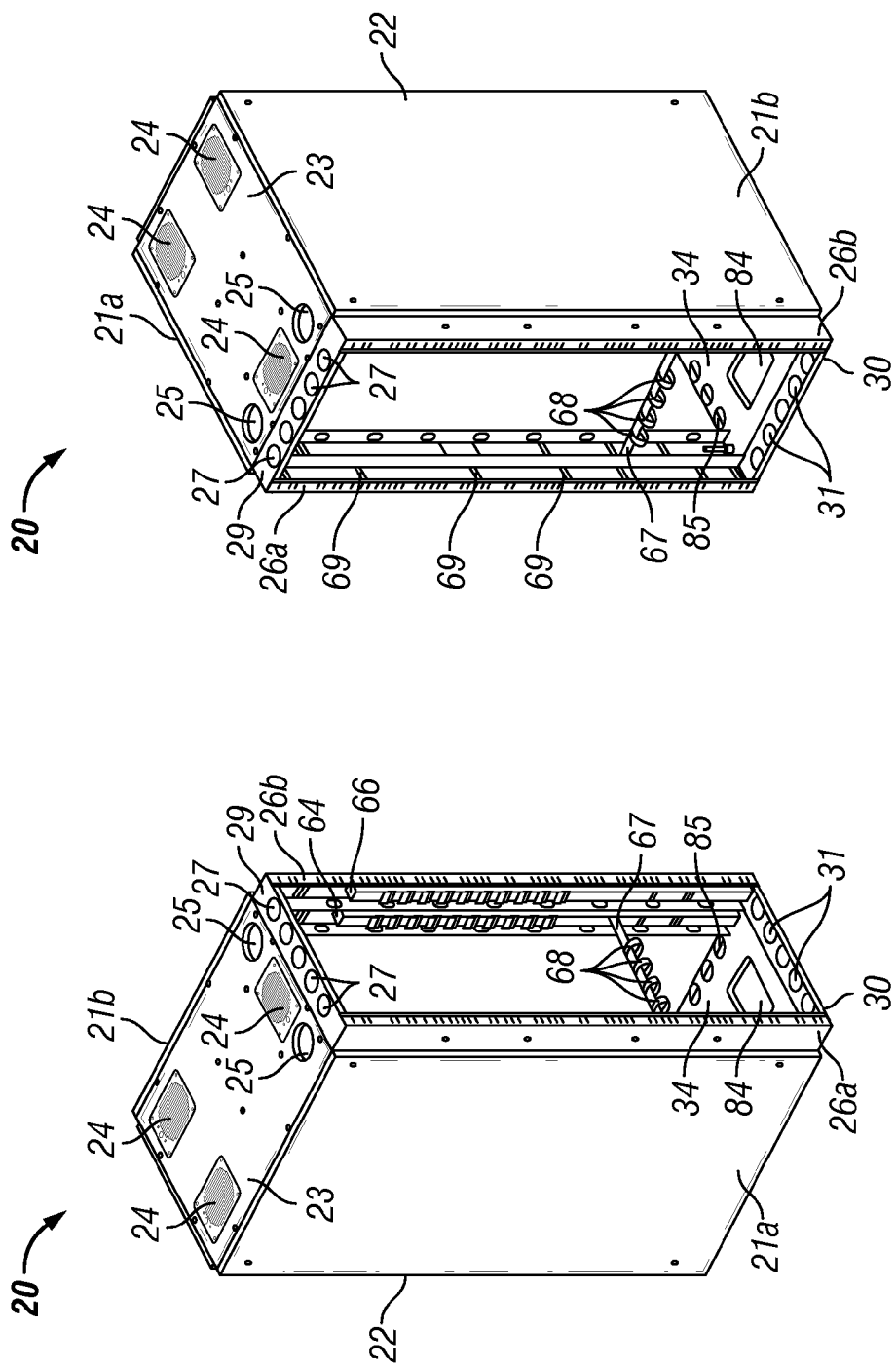

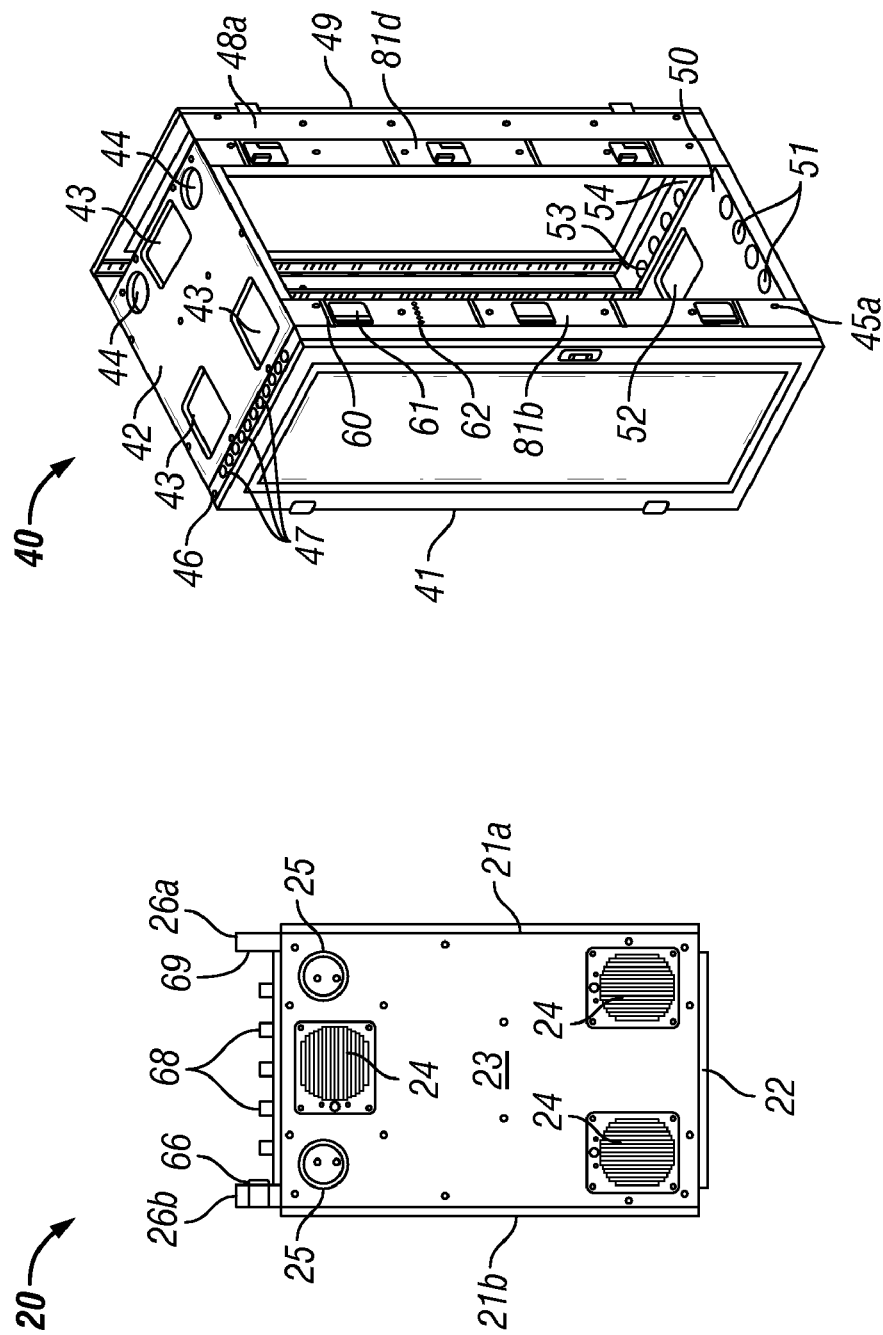

CABLE AND AIR MANAGEMENT ADAPTER SYSTEM FOR ENCLOSURES HOUSING ELECTRONIC EQUIPMENT

CROSS REFERENCE TO RELATED APPLICATION

This application claims the benefit of U.S. Provisional Application Ser. No. 60/417,931, filed Oct. 11, 2002, having the same title and naming the same inventors as this application.

BACKGROUND OF THE INVENTION

1. Field of the Invention

The present invention relates generally to a cable and air management adaptation system for enclosures housing electronic equipment.

2. Description of the Related Art

For the past several years advances in the development and performance of electronic equipment such as computer hardware (i.e. client/server systems and switching devices) and electronic equipment used in industrial control applications (i.e., distributed control systems, programmable logic controllers and fieldbus devices), have resulted in smaller, more numerous and densely packed equipment. While these advances have typically reduced the amount of space per item required to house the equipment in enclosures, the heat output generated by this equipment has increased. Excessive heat buildup within an enclosure can result in premature equipment failure, negatively effect the equipment's performance and result in costly downtime. As a result, to assure optimum and reliable performance of housed systems, current use of enclosures that house electronic equipment require the user consider airflow and heat distribution, as well as cable management.

Airflow and heat distribution considerations include the air entry and discharge locations of external cooling systems, whether the enclosure is mounted atop a raised floor, the proximity of surrounding equipment, as well as air distribution and cable routing inside the enclosure. Cabling for electronic equipment's power and communications typically enters the enclosure from the top and/or bottom. The cables' internal routing can adversely affect the operation of the equipment, heat rejection and air distribution within the enclosure. To mitigate some of these problems, enclosure manufacturers typically provide a variety of enclosure frame depths, cable channels and fans in an attempt to ensure proper operation of the equipment. However, these approaches limit adaptation of the enclosure to the changing requirements of the enclosure based on changes in the housed equipment and/or the enclosure's external environment. These changing requirements typically occur in the front and rear of the enclosure where most airflow, heat distribution and cabling issues exist.

SUMMARY OF THE INVENTION

To that end, the cable-air management adapter system ("CAMAS") of the present invention provides a platform or modular approach to solve airflow, heat buildup and cable routing concerns in enclosures that house electronic equipment. The present invention allows the user to adapt the enclosure to current or future needs by adding or removing expansion channels and various airflow and cable management options, eliminating the need to replace or add additional enclosures to meet increased enclosure size requirements.

Rather than using multiple fixed frames sizes, the CAMAS of the present invention allows users to work from a single frame to increase an enclosure's size and install multiple airflow, heat dissipation and cable support management options. Most users tend to need increased space in the front and/or rear of enclosures, where most airflow, heat and cabling issues exist. However, the present invention is designed to increase enclosure space in the front, rear, side, top and/or bottom of the enclosure with the addition of expansion channels.

The expansion channels are used as a platform to add the various airflow, heat dissipation and cable management options. The CAMAS components of the present invention can be added or removed as a user's application requirements change. The expansion channel approach allows air management options to interface with a broad range of external cooling systems configurations, as well as other external environmental considerations such as raised floors, ceiling systems and hot-cold isle data centers. In addition, while housed electronic equipment typically draws air from the front of its enclosure and discharges hot air the to the rear, the CAMAS of the present invention allows the user to focus performance management in these key areas.

The expansion channel configuration of the present invention provides a more flexible configuration for both cable entry and internal cable routing. For example, the expansion channel configuration allows for easier separation of power and communication cables. In addition, the cable management options also aid in enclosure air distribution and limiting internal heat generation, by minimizing air blockage caused by bundled or densely populated cables within the enclosure.

In one embodiment of the present invention, expansion channels are coupled to the enclosure's frame members in the front, rear, top, bottom and/or sides of the enclosure. The expansion channels can vary in depth in order to accommodate the user's specific needs. In this embodiment, a cover door can be coupled to the expansion channels covering access to the enclosure.

In a further aspect of the present invention, the expansion channels can include a cover plate mounted on either or both the bottom and top of the expansion channels. The cover plate can be a solid plate or it can have holes, cutouts, slots or knockout portions to facilitate cable entrance into the enclosure and allow better cable management within the enclosure. In this embodiment, the cover plate can also include baffles, deflectors and/or dampers to redirect airflow. The cover plate can also include air intake fan modules that draw air into the enclosure in order to cool the enclosure. The cover plate can also include air exhaust fan modules that remove the heat from the enclosure. Still, the cover plate can also include enhanced air delivery and air extraction components by having air ducts directly coupled to an opening in the cover plate and coupled to a primary cooling system. In a further aspect of this embodiment, when the enclosure is mounted atop a raised floor, a fan assembly located in the bottom expansion channels' cover plate can provide cool air intake into the enclosure from beneath the raised floor.

In another embodiment of the present invention, a horizontal cable rail is mounted across the expansion channels and provides horizontal cable management. Multiple cable rails can be placed across the expansion channels based on the user's requirements. In this embodiment, horizontal cable rings can be mounted to the cable rail. The cable rings further assists in horizontally managing cable routing. The cable rings can be fixed or adjustable, such as an adjustable Velcro strap wrapped around single or multiple cables.

In yet another embodiment of the present invention, cable management options are mounted in the expansion channels. For example, vertical cable rings are mounted in the expansion channels and assist in the vertical cable management of cable routing. Other options include a power strip mounted to an expansion channel in order to provide power for the electronic equipment housed within the enclosure.

Still other embodiments of the present invention include multiple expansion channels that are coupled to provide for an increased depth expansion of the enclosure, providing for a myriad of cable and airflow management options.

Other objects and advantages of the invention will become apparent upon reading the following detailed description and upon reference to the drawings.

BRIEF DESCRIPTION OF THE DRAWINGS

FIGS. 2A-2D illustrate various views of the enclosure depicted in FIG. 2.

FIG. 3 illustrates a variation of an enclosure having the CAMAS of the present invention.

DESCRIPTION OF ILLUSTRATIVE EMBODIMENTS

Figure 1:
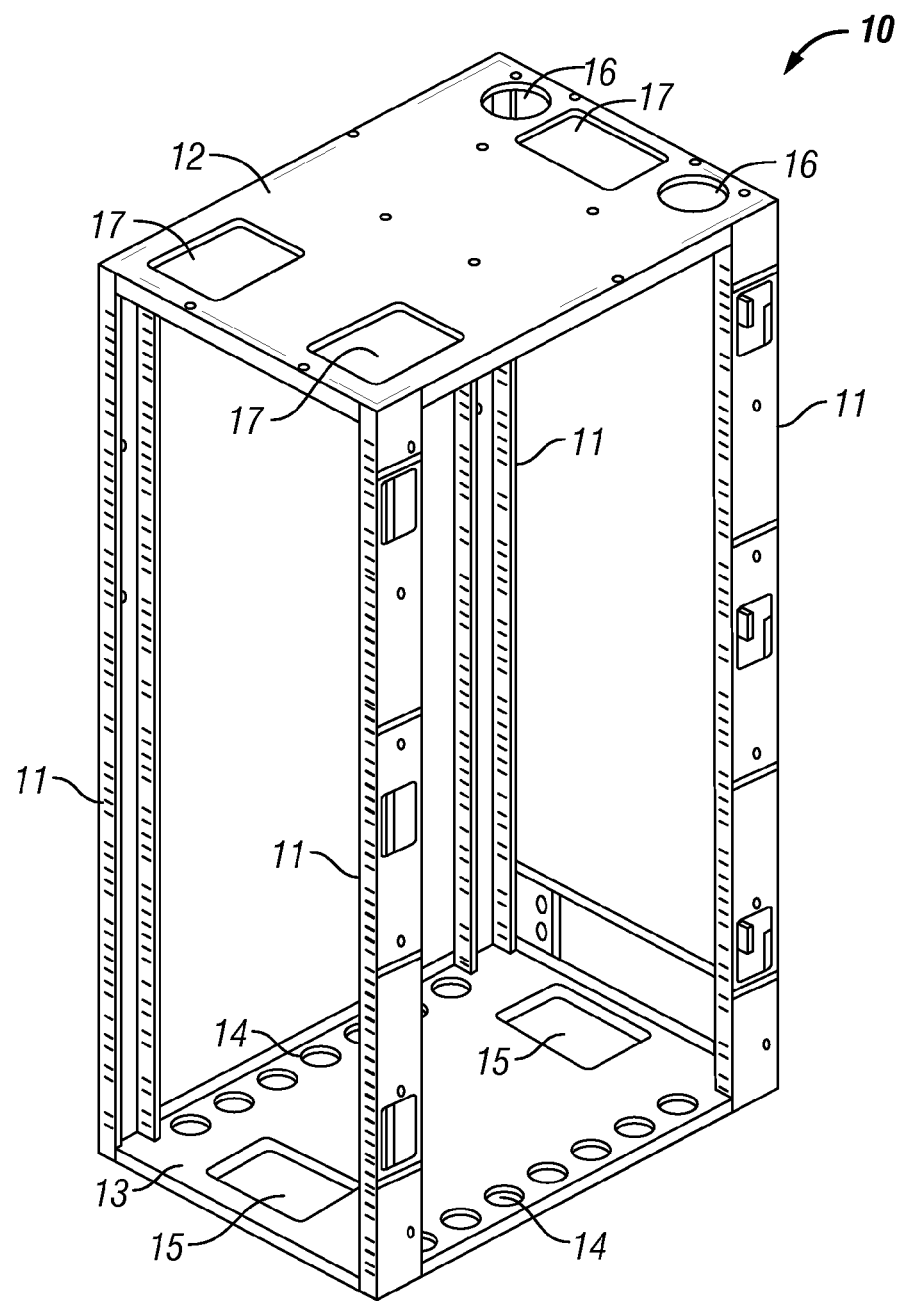
FIG. 1 illustrates a typical prior art enclosure frame structure.

FIG. 1 illustrates a typical prior art frame assembly 10 of an enclosure that houses electronic equipment. The frame assembly 10 includes four vertical frame members 11, a top plate 12 and bottom plate 13. The four vertical frame members 11 are typically coupled to the top and bottom plates 12 and 13, respectively, by bolting, riveting or welding in order to form the enclosure frame body. The top plate 12 has cable or conduit cutouts 16 that allow cable entrance into the enclosure. The top plate 12 also has cooling fan cutouts 17 that allow a fan module (not shown) to be mounted therein. The fan module circulates air through the enclosure 10 in an effort to cool the enclosure and displace the heat generated by the electronic equipment housed within the enclosure 10. Similarly, the bottom plate 13 also has cable cutouts 14 that allow cables to enter the enclosure 10 and fan cutouts 15 that allow fan modules to cool the enclosure 10.

Figure 2A:
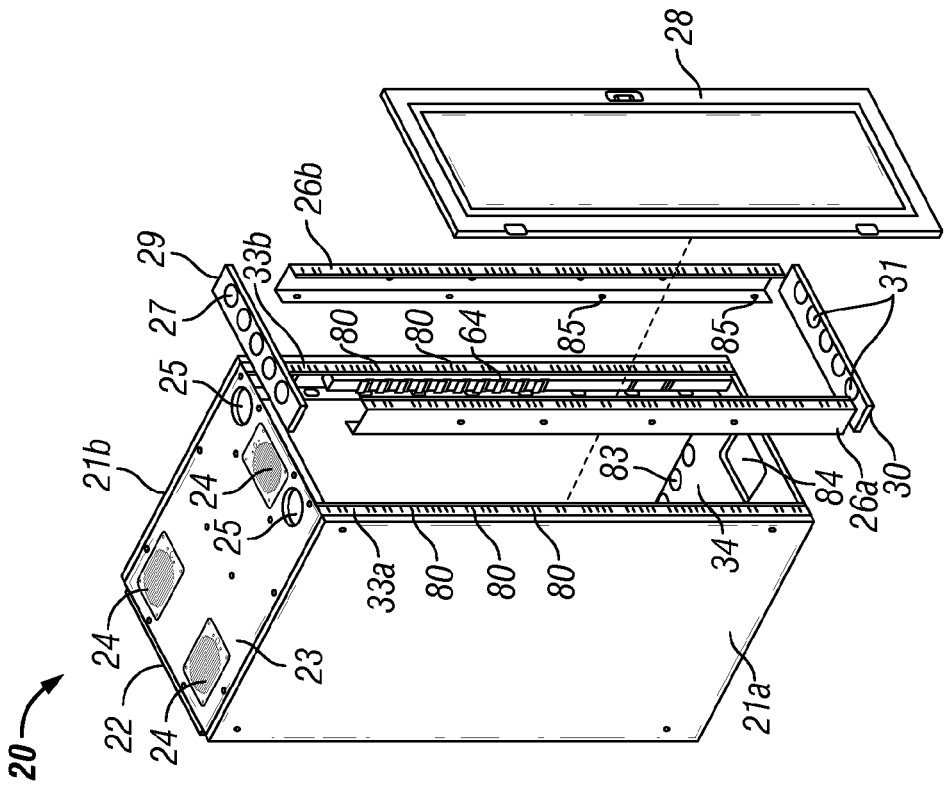
Figure 2:
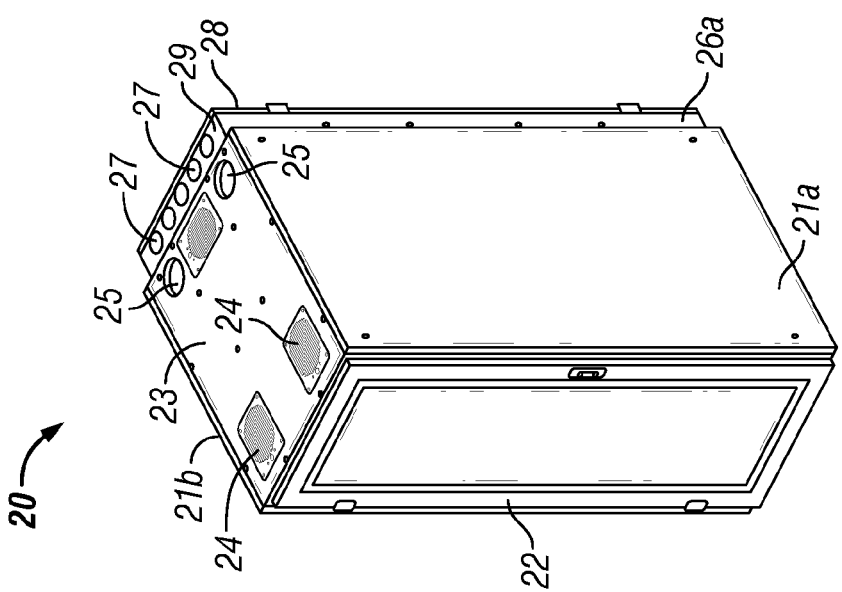
FIG. 2 illustrates an enclosure having the cable/air management adapter system ("CAMAS") of the present invention.

FIGS. 2 through 2D illustrate various exemplary embodiments of an electronic equipment enclosure 20 having a cable and air management adapter system ("CAMAS") according to the present invention. The enclosure 20 includes a frame assembly sub-structure similar to the frame assembly 10 depicted in FIG. 1. In FIG. 2A, frame vertical members 33a, 33b illustrate a portion of the frame assembly. The frame vertical members 33a, 33b have a plurality of connection holes 80. Coupled to the frame assembly are side panels 21a, 21b, a front access cover 22 and left and right rear expansion channels 26a and 26b, respectively. Mounted atop the enclosure 20 is a top plate 23 that has cable entrance cutouts 25 and enclosure fan modules 24. On the bottom of the enclosure is a bottom plate 34 that also has cable entrance cutouts 83 and fan module cutouts 84. The top and bottom plates' cable entrance cutouts 25, 83 permit cable entry into the enclosure 20. The top plate fan modules 24 typically are air exhaust fans that discharge the heated air within the enclosure 20.

The rear expansion channels 26a, 26b have a plurality of connection holes 85 (see FIG. 2A) that allow the rear expansion channels 26a, 26b to be coupled to the frame vertical members 33a, 33b by inserting any suitable connector into the rear expansion channels' holes 85 and through the frame vertical members' holes 80. The left rear expansion channel 26a is coupled to the frame vertical member 33a and the right rear expansion channel 26b is coupled to the frame vertical member 33b. The rear expansion channels 26a, 26b form an expanded enclosure 20 platform that provides additional space for airflow and cable management options in accordance with the present invention.

Coupled to the expansion channels 26a, 26b is an optional top expansion channel cover plate 29 that has a plurality of cutouts 27. Attached to the bottom of the expansion channels 26a, 26b is an optional bottom plate cover 30 that also has a plurality of cutouts 31. The top and bottom expansion channel cover plates' cutouts 27, 31 provide cable entrances and/or airflow entrance points. In another aspect of the present invention, it can be appreciated that rather than having cutouts 27, 31 either or both of the top and bottom expansion channel cover plates 29, 30 can include a solid cover, slots, baffles, deflectors, dampers and/or fan modules to direct the airflow. When the top and/or bottom expansion channel cover plates' cutouts 27, 31 are used as cable entrance points, it allows the user to better manage cable placement within the enclosure 20. Cable management assists in minimizing air blockage within an enclosure caused by the bundling and placement of cables.

Also shown in FIG. 2A is a first power strip 64. As shown the first power strip 64 is mounted within the frame structure; however, it can be appreciated that the first power strip 64 and/or additional power strips can be mounted in the expansion channels 26a, 26b in accordance with additional embodiments of the present invention. Referring to FIGS. 2B through 2D, an additional exemplary embodiment in accordance with the present invention is shown. In this embodiment, mounted within the right expansion channel 26b is a second power strip 66. Although the first power strip 64 is shown remaining within the enclosure 20, the first power strip 64 can be removed allowing the user additional space within the enclosure 20. The installation of the second power strip 66 in the right expansion channel 26b allows the user to adapt the enclosure 20 for better management of space, cable routing and airflow.

Additional cable management aspects of the present invention are also shown in FIGS. 2B through 2D. As shown, interposed between the enclosure's vertical frame members 33a, 33b and the expansion channel 26a, 26b is a cable rail 67 that has a plurality of horizontal cable rings 68 mounted thereto. The cable rail 67 can be mounted to the vertical frame members 33a, 33b and/or the expansion channels 26a, 26b. The horizontal cable rings 68 can be adjustable strap devices that adjustably wrap around the cables or rigid devices designed to have cables held therein in order to secure the cables in place and provide for horizontal cable routing management. Although only one cable rail 67 is shown in FIG. 2B, multiple cable rails 67 can be installed at any location along the length of the expansion channels 26a, 26b, in order to provide optimum cable and/or airflow management.

As shown in FIGS. 2C and 2D, the left expansion channel 26a includes a plurality of vertical cable rings 69. The vertical cable rings 69 of the left expansion channel 26a allow the user to place the cables outside of the coveted enclosure space, vertically support the cables along the length of the expansion channel 26a and optimize cable routing and placement. It can be appreciated that rather than have the optional second power strip 66 mounted to the right expansion channel 26b, vertical cable rings 69 can be mounted within the right expansion channel 26b, providing for increased cable routing and airflow management. For example, by placing the vertical cable rings 69 in both the left and right expansion channels 26a, 26b, the user can separate power and communications cable, reducing any electromagnetic interference due to cable routing. Both the horizontal and vertical cable rings 68, 69 can be mounted to their respective cable rail 67 and expansion channels 26a, 26b using any suitable connection or the horizontal and vertical rings 68, 69 can be integral to their respective cable rail 67 and expansion channels 26a, 26b. The horizontal and vertical cable rings 68, 69 offer efficient positioning of cables to allow easier identification and reduce interior clutter.

Figure 3B:
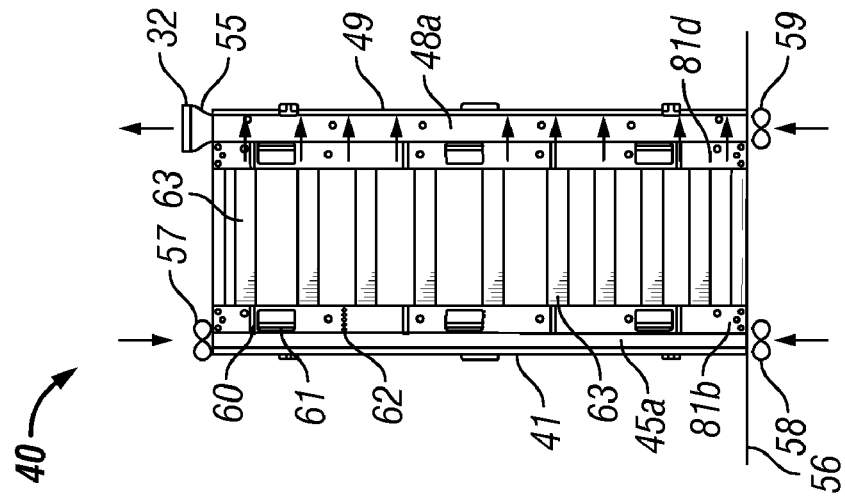
FIGS. 3A-3D illustrate various views of the enclosure depicted in FIG. 3.
Figure 3A:
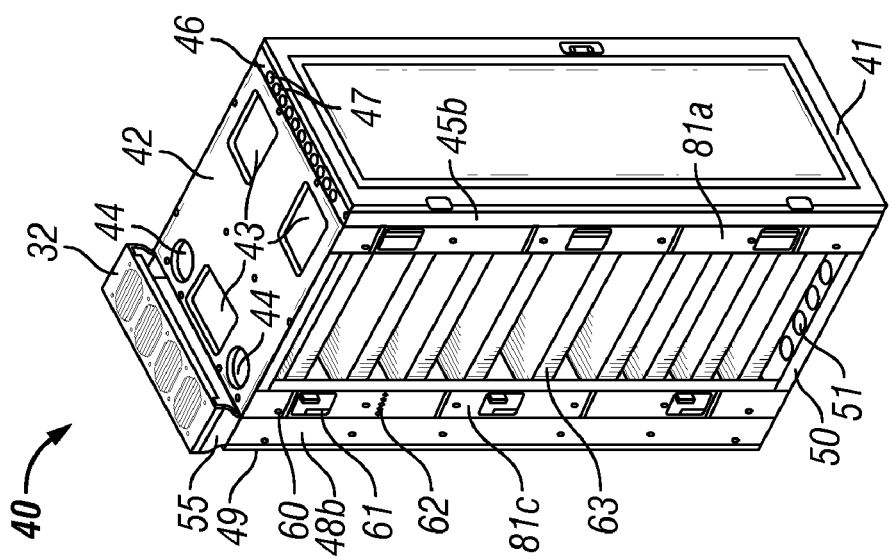
Figure 3D:
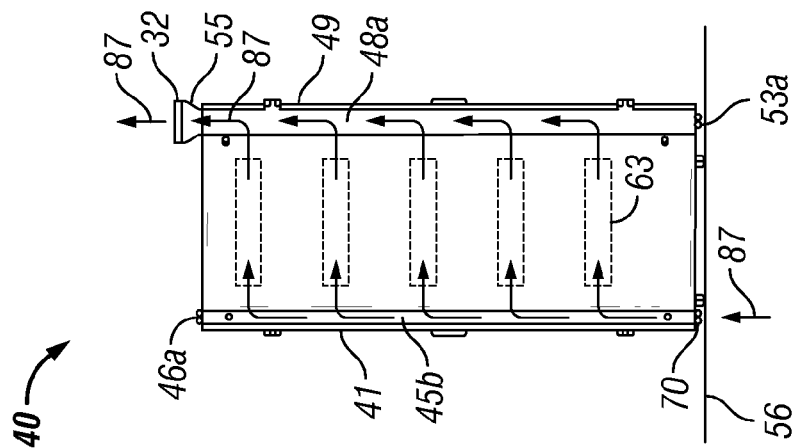

Still other exemplary embodiments of the present invention are shown in FIGS. 3 through 3D. In these embodiments, an enclosure 40 is shown without side panels so that outline views of the enclosure's electronic equipment 63 can be shown. The enclosure 40 includes a top cover plate 42, vertical frame members 81a, 81b, 81c, 81d and bottom plate 50. The vertical frame members 81a, 81b, 81c, 81d are coupled to the top cover plate 42 and the bottom plate 50 to form the enclosure frame. The top cover plate 42 has cable entrance cutouts 44 and fan module cutouts 43. The bottom plate has cable entrance cutouts 51 and fan module cutouts 52. The vertical frame members 81a, 81c are shown in detail in FIG. 3A and the vertical frame members 81b, 81c are shown in detail in FIG. 3B. The vertical frame members 81a, 81b, 81c, 81d have horizontal slots 60, squares 61 and diamond shaped holes 62. The horizontal slots 60 allow the user to change the distance between internal mounting rails (not shown) at various points along the length of the vertical frame members 81a, 81b, 81c, 81d. The enclosure's electronic equipment 63 is mounted to the internal mounting rails. The squares 61 provide cable routing spaces and the diamond shaped holes 62 allow the user to properly align the internal mounting rails at various points along the length of the vertical frame members 81a, 81b, 81c, 81d.

As depicted in FIGS. 3 through 3B, the enclosure 40 also includes front right and left expansion channels 45a and 45b, respectively, and rear left and right expansion channels 48a and 48b, respectively. The front right expansion channel 45a is coupled to the vertical frame member 81b. The front left expansion channel 45b is coupled to the vertical frame member 81a. The rear right expansion channel 48b is coupled to the vertical frame member 81c. The rear left expansion channel 48a is coupled to the vertical frame member 81d. A front door 41 is coupled to the front expansion channels 45a, 45b and a rear door 49 is coupled to the rear expansion channels 48a, 48b. Mounted atop the front expansion channels 45a, 45b is an expansion channel top cover 46. The front expansion channels' top cover 46 has a plurality of cable entrance cutouts 47. Although the front expansion channels' top cover 46 is depicted as having a plurality of cable entrance cutouts 47, the top cover 46 can include a solid cover and a cover with a cutout for a fan module.

As shown in FIGS. 3 through 3B, the front expansion channels 45a, 45b have a smaller depth than the depth of the rear expansion channels 48a, 48b. However, it can be appreciated that both the front and rear expansion channels 45a, 45b, 48a, 48b can have equal depths; or the front expansion channels 45a, 45b can have a depth greater than the depth of the rear expansion channels 48a, 48b. Moreover, it can also be appreciated that multiple expansion channels can be coupled to either the front or rear of the enclosure 40, based on the needs of the user.

Also shown in FIGS. 3A and 3B, mounted atop the rear expansion channels 48a, 48b is a fan assembly 55 that includes a plurality of fans. Covering the fan assembly 55 is a fan cover 32 that is designed to cover access to the fan blades. In this embodiment, the fan assembly 55 can operate as either air an intake or air exhaust fan assembly 55. If operated as an air intake fan assembly 55, the fan assembly 55 can include a filter (not shown), to prevent foreign particles from entering the enclosure 40. Additional embodiments of the present invention can include fan modules and/or fan assemblies being placed atop and below the rear expansion channels 48a, 48b, as well as atop and below the front expansion channels 45a, 45b, as shown in FIG. 3B.

As shown in FIG. 3B, the enclosure 40 sets atop a raised floor 56 and fan assemblies 58, 59 are mounted beneath the enclosure 40 in the raised floor 56 space. In this embodiment, both the front and rear expansion channel members 45a, 45b, 48a, 48b can have an open bottom, without a bottom plate 53 or the bottom plate 53 can have openings 54 as shown in FIG. 3. The enclosure 40 can also include a fan assembly 57 mounted atop the front expansion channels 45a, 45b as shown in FIG. 3B. During operation of the fan assembly 55 as shown in FIG. 3B, fan assemblies 57, 58 and 59 act as air intake fan assemblies 57, 58, 59 bringing cool air into the enclosure. The fan assembly 55 operates as an air exhaust fan assembly 55 removing hot air from the enclosure 40, while also pulling cool air into the enclosure 40, in order to prevent excessive heat buildup within the enclosure 40.

Figure 3C:
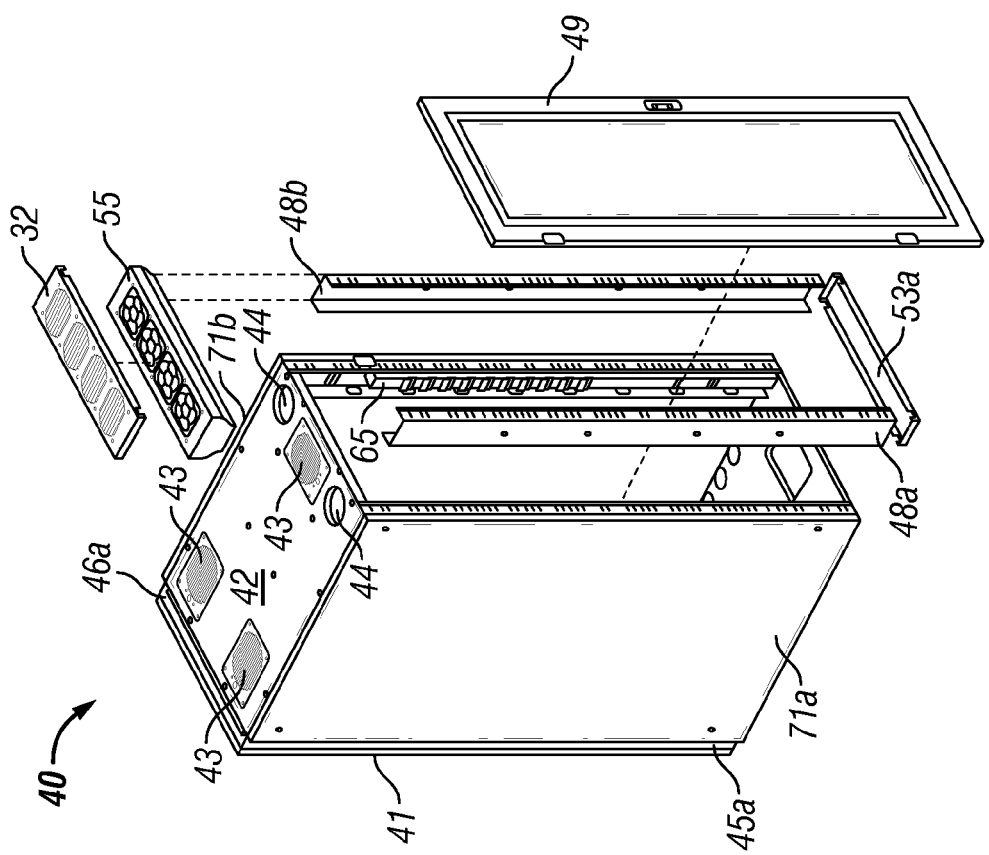

Referring to FIGS. 3, 3C and 3D, another exemplary embodiment of the present invention is shown. In this embodiment, the front expansion channels' top cover plate 46a is a solid cover plate and the front expansion channels' bottom cover plate 70 has an opening. The rear expansion channels' bottom cover plate 53a is solid. During operation, the rear expansion channels' fan assembly 55 operates as an air exhaust fan assembly inducing the draft flow of cool air throughout the enclosure 40a and over the electronic equipment 63 as shown in FIG. 3D by the airflow arrows 87.

Still another embodiment of the present invention includes enhanced air delivery, air extraction and/or air circulation by having air ducts directly coupled to a primary cooling system and coupled to at least one cutout in the top and/or bottom cover plates.

Other alternative embodiments of the present invention include one side of the expansion channel assembly having a hinge, allowing better access to the electronic equipment housed within the enclosure. Similarly, rather than adding expansion channels to the enclosure frame, the enclosure's door cover could have an increased depth having the cable and airflow management options disclosed herein. In both of these alternative embodiments, the cables mounted to the hinged expansion channels or the depth increased door have enough play to ensure proper movement the expansion channels or door without causing the disconnection of or damage to the cables. Although, the figures illustrate the expansion channels being coupled to the front and/or rear of the enclosure, it can be appreciated that the present invention also embodies the coupling of expansion channels to the sides, top and/or bottom of the enclosure and is determined based on user specific requirements. The present invention facilitates the expansion of an enclosure based on system changes such as the installation and/or replacement of new electronic equipment, in order to adapt the enclosure for changing airflow and cable management requirements.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. An enclosure housing for electronic equipment, the enclosure comprising:
   a frame structure having a plurality of frame members;
   first and second expansion channels, the first expansion channel being coupled to a corresponding first one of the frame members and the second expansion channel being coupled to a corresponding second one of the frame members, wherein the first and second expansion channels form an expanded section of the enclosure housing; and
   a cable support device mounted to at least one of the expansion channels and positioned in the expanded section of the enclosure housing, such that a cable supported by the cable support device is situated in the expanded section of the enclosure housing.

2. The enclosure housing of claim 1 further comprising at least one cover plate removably coupled to the first and second expansion channels.

3. The enclosure housing of claim 2 wherein the cover plate has at least one baffle, deflector or damper.

4. The enclosure housing of claim 2 wherein the cover plate has at least one hole, cutout, or knockout portion.

5. The enclosure housing of claim 4 further comprising an air duct having two ends, one end of the air duct coupled to a cooling system and the other end of the air duct coupled to the hole, cutout or knockout portion.

6. The enclosure housing of claim 4 further comprising a fan assembly mounted within the hole, cutout or knockout portion.

7. The enclosure housing of claim 6 wherein the fan assembly is an air intake assembly.

8. The enclosure housing of claim 6 wherein the fan assembly is an air exhaust assembly.

9. The enclosure housing of claim 6 wherein the fan assembly is capable of operating as an air intake or air exhaust assembly.

10. The enclosure housing of claim 6 wherein the fan assembly is capable of operating as an air circulation assembly.

11. The enclosure housing of claim 6 further comprising a cover plate mounted on the fan assembly.

12. The enclosure housing of claim 11 further comprising a filter mounted within the fan assembly cover plate.

13. The enclosure housing of claim 1 further comprising at least one power strip mounted to the first expansion channel.

14. The enclosure housing of claim 1 wherein the cable support device comprises a cable rail or tray interposed between the first and second expansion channels, the cable rail or tray capable of supporting a cable in the expanded section of the housing.

15. The enclosure housing of claim 14, wherein the cable rail or tray further comprises at least one cable ring capable of further supporting a cable.

16. The enclosure housing of claim 15, wherein the cable ring is a Velcro strap.

17. The enclosure housing of claim 1 further comprising a door coupled to the first and second expansion channels.

18. The enclosure housing of claim 17 wherein the door has a transparent portion.

19. The enclosure housing of claim 1 further comprising third and fourth expansion channels, the third expansion channel being coupled to the first expansion channel, the fourth expansion channel being coupled to the second expansion channel.

20. The enclosure housing of claim 1 wherein at least one of the first and second expansion channels has a hinge.

21. A method of housing electronic equipment comprising:
   providing an enclosure including a frame structure having at least first and second frame members;
   coupling a first expansion channel to the first frame member and a second expansion channel to the second frame member to form an expanded section of the enclosure;
   attaching a cable support device to at least one of the first or second expansion channels;
   placing electronic equipment with cables in the enclosure; and
   supporting the cables with the cable support device such that the cables are positioned in the expanded section of the enclosure.

22. The method of claim 21, further comprising coupling at least one cover plate between the first and second expansion channels.

23. The method of claim 22, wherein the cover plate has at least one hole, cutout, or knockout portion, and further comprising connecting an air duct to the hole, cutout or knockout portion.

24. The method of claim 22, wherein the cover plate has at least one hole, cutout, or knockout portion, and further comprising mounting a fan assembly within the hole, cutout or knockout portion.

25. The method of claim 21, further comprising mounting at least one power strip to an interior surface of at least one of the first or second expansion channels.

26. The method of claim 21, further comprising attaching a door to the expanded section of the enclosure.

* * * * *